United States Patent
Lee et al.

(10) Patent No.: US 7,956,658 B2
(45) Date of Patent: Jun. 7, 2011

(54) DIGITAL LOCK DETECTOR AND FREQUENCY SYNTHESIZER USING THE SAME

(75) Inventors: Ja Yol Lee, Daejeon (KR); Seong Do Kim, Daejeon (KR); Mun Yang Park, Daejeon (KR); Cheon Soo Kim, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/607,395

(22) Filed: Oct. 28, 2009

(65) Prior Publication Data

US 2010/0271072 A1    Oct. 28, 2010

(30) Foreign Application Priority Data

Apr. 24, 2009    (KR) .................. 10-2009-0036029

(51) Int. Cl.
    *H03L 7/06*    (2006.01)
(52) U.S. Cl. ................ 327/159; 327/12; 327/107
(58) Field of Classification Search ........ 327/12, 327/107, 150, 159
    See application file for complete search history.

(56) References Cited

U.S. PATENT DOCUMENTS

| | | | |
|---|---|---|---|
| 5,909,130 A | 6/1999 | Martin et al. | |
| 5,978,427 A * | 11/1999 | Kuhara | 375/376 |
| 6,714,083 B2 * | 3/2004 | Ishibashi | 331/1 A |
| 6,747,519 B2 | 6/2004 | Jaehne et al. | |
| 7,116,145 B2 * | 10/2006 | Kim et al. | 327/156 |
| 2007/0285082 A1 | 12/2007 | Kimura et al. | |
| 2008/0084233 A1 * | 4/2008 | Lee | 327/156 |

FOREIGN PATENT DOCUMENTS

KR    10-2007-0061049 A    6/2007

OTHER PUBLICATIONS

Robert Bogdan Staszewski et al., "All-Digital PLL with Ultra Fast Settling", IEEE Transactions on Circuits and Systems-II: Express Briefs, pp. 181-185, vol. 54, No. 2, Feb. 2007.

* cited by examiner

*Primary Examiner* — Lincoln Donovan
*Assistant Examiner* — William Hernandez
(74) *Attorney, Agent, or Firm* — Rabin & Berdo, PC

(57) ABSTRACT

There is provided a digital lock detector and a frequency synthesizer using the same. The digital lock detector includes a comparator unit receiving a plurality of control bits, and generating a bit signal to notice a lock condition of the plurality of control bits; a delay cell block generating a plurality of delay signals based on the bit signal, and outputting a clock signal by combining the bit signal and the plurality of delay signals; and a detection unit detecting a shift time of the clock signal, and generating a lock indication signal according to the detection result.

6 Claims, 7 Drawing Sheets

US 7,956,658 B2

DIGITAL LOCK DETECTOR AND FREQUENCY SYNTHESIZER USING THE SAME

CROSS-REFERENCE TO RELATED APPLICATIONS

This application claims the priority of Korean Patent Application No. 10-2009-0036029 filed on Apr. 24, 2009, in the Korean Intellectual Property Office, the disclosure of which is incorporated herein by reference.

BACKGROUND OF THE INVENTION

1. Field of the Invention

The present invention relates to a digital lock detector and a frequency synchronizer using the same, and more particularly, to a digital lock detector capable of detecting whether or not a frequency outputted from a phase locked loop (hereinafter, referred to as 'PLL') is locked, and a frequency synthesizer using the same.

2. Description of the Related Art

Typically, charge pump PLLs have been widely used in designing radio frequency (RF) synthesizers for multi-band mobile communications. Analog circuits designing technology is integrated in such charge pump PLLs.

Thus, it is difficult to integrate a charge pump PLL with a digital baseband-signal processing block because of the characteristics of analog circuits and analog signals in which a separate analog/RF library needs to be added to a design library provided in a standard digital complementary metal-oxide-semiconductor (CMOS) process. However, with the recent development of process techniques, digital baseband-signal processing blocks are under development using nanoscale digital CMOS processes.

A frequency synthesizer using a digital PLL, according to the related art, is unsuited to a local oscillator demanding high-quality phase noise, due to its high phase noise and jitter noise. Recently, all-digital PLLs (ADPLLs) that are achieved by applying digital PLL techniques to frequency synthesizers for mobile communications have been developed and used.

An ADPLL utilizes a digitally controlled oscillator (DCO), which may be realized using an LC resonator. Thus, the ADPLL has superior characteristics regarding phase noise and jitter noise.

Therefore, studies on digital lock detectors are ongoing in order to detect the lock condition of a digital PLL in a quick and accurate manner.

SUMMARY OF THE INVENTION

An aspect of the present invention provides a digital lock detector capable of detecting the lock condition of a digital PLL by using simple delay circuits and comparator circuits, and a frequency synthesizer using the same.

According to an aspect of the present invention, there is provided a digital lock detector comprising: a comparator unit receiving a plurality of control bits, and generating a bit signal to notice a lock condition of the plurality of control bits; a delay cell block generating a plurality of delay signals based on the bit signal, and outputting a clock signal by combining the bit signal and the plurality of delay signals; and a detection unit detecting a shift time of the clock signal, and generating a lock indication signal according to the detection result.

The comparator unit may output the single-bit signal by calculating time for which each of the plurality of control bits is locked, and time for which the plurality of control bits are all locked.

The comparator unit may include: a plurality of delays delaying the plurality of control bits by a preset time, respectively; a plurality of comparators performing an exclusive OR (XOR) between the plurality of control bits and output of the plurality of delays; and an logic operator generating the bit signal by performing an OR operation on output of the plurality of comparators.

The delay cell block may include: a delay part generating the plurality of delay signals based on the bit signal; and a logic operation part performing an OR operation on the bit signal and the plurality of delay signals generated by the delay part.

The delay part may include a plurality of delays connected in series to each other, and generates the plurality of delay signals through the plurality of delays, wherein the logic operation part performs an OR operation on the bit signal and the plurality of delay signals generated by the plurality of delays The detection unit may include: a latch circuit detecting a time point when the clock signal outputted from the delay cell block shifts its logic state; and a pulse generator generating the lock indication signal on the basis of an output of the latch circuit.

According to another aspect of the present invention, there is provided a frequency synthesizer comprising: a digital control oscillator adjusting a frequency of output signal according to a plurality of control bits; a phase detector feeding back the output signal of the digital control oscillator and outputting an error signal; a digital loop filter generating the plurality of control bits from the error signal; and a digital lock detector receiving the plurality of control bits, and generating the lock indication signal to notice whether the output signal is locked to a target frequency or not.

The digital lock detector may include: a comparator unit receiving a plurality of control bits provided from the digital loop filter, and generating a bit signal to notice a lock condition of the plurality of control bits; a delay cell block generating a plurality of delay signals based on the bit signal, and outputting a clock signal by combining the bit signal and the plurality of delay signals; and a detection unit detecting a shift time of the clock signal, generating the lock indication signal according to the detection result, and providing the lock indication signal to the digital control oscillator.

The comparator unit may output the single-bit signal by calculates time for which each of the plurality of control bits is locked, and time for which the plurality of control bits are all locked.

The comparator unit may include: a plurality of delays delaying the plurality of control bits by a preset time, respectively; a plurality of comparators performing an exclusive OR (XOR) between the plurality of control bits and output of the plurality of delays; and an logic operator generating the bit signal by performing an OR operation on output of the plurality of comparators.

The delay cell block may include: a delay part generating the plurality of delay signals based on the bit signal; and a logic operation part performing an OR operation on the bit signal and the plurality of delay signals generated by the delay part.

The delay part may include a plurality of delays connected in series to each other, and generates the plurality of delay signals through the plurality of delays, wherein the logic operation part performs an OR operation on the bit signal and the plurality of delay signals generated by the plurality of delays The detection unit may include: a latch circuit detecting a time point when the clock signal outputted from the delay cell block shifts its logic state; and a pulse generator generating the lock indication signal on the basis of an output of the latch circuit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
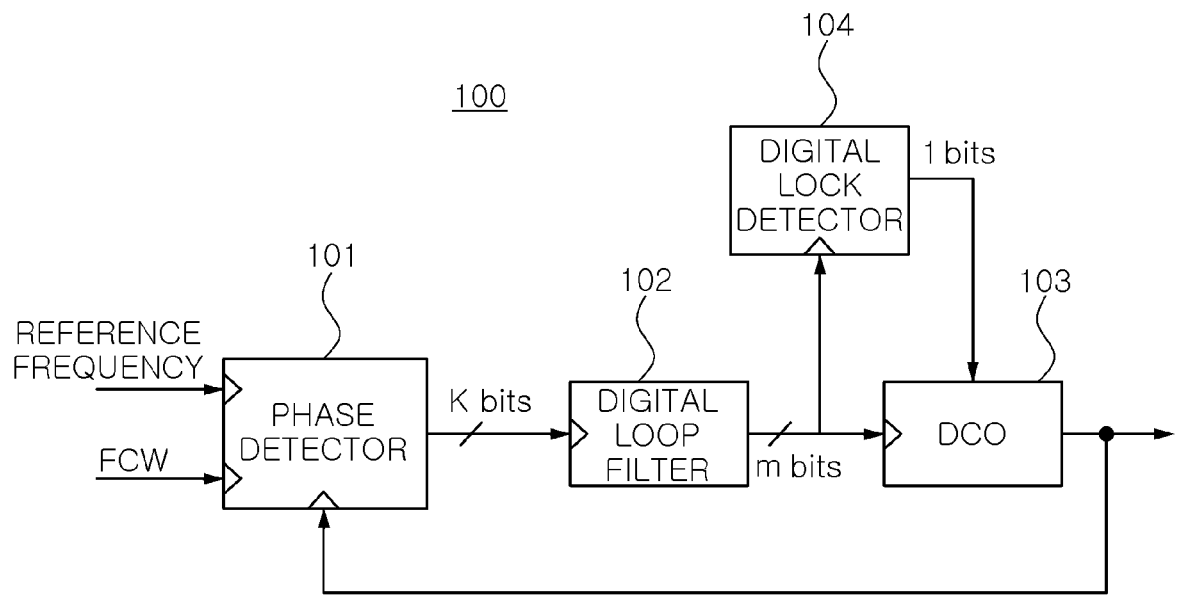
FIG. 1 is a configuration view showing a frequency synthesizer using a digital lock detector according to an exemplary embodiment of the present invention.

Exemplary embodiments of the present invention will now be described in detail with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

FIG. 1 is a configuration view illustrating a frequency synthesizer according to an exemplary embodiment of the present invention.

Referring to FIG. 1, a frequency synthesizer 100, according to this embodiment, may include a digitally controlled oscillator (hereinafter referred to as 'DCO') 103, a phase detector 101, a digital loop filter 102, and a digital lock detector 104.

A frequency from the DCO 103 may be adjusted by a control bit being inputted thereto. The frequency outputted from the DCO 103 controls the DCO 103 again after passing through the phase detector 101 and the digital loop filter 102, thereby forming a phase locked loop (hereinafter, referred to as 'PLL) in the frequency synthesizer 100. As for the PLL, a PLL frequency is determined by the value of a frequency command word (FCW) inputted in order to obtain a desired frequency. The PLL may continuously trace an error of the phase detector 101 so that the frequency from the DCO 103 is locked to the determined PLL frequency.

According to this embodiment, the DCO 103 may be an LC resonance DCO implemented using an LC resonator. The LC resonance DCO may adjust an oscillation frequency by controlling a fine variation in the capacitance of the LC resonator. The LC resonance DCO may include a coarse adjustment bank and a fine adjustment bank, each of which is configured as a capacitor bank. The coarse adjustment bank and the fine adjustment bank may be configured to have different frequency resolutions. In the LC resonance DCO, the coarse adjustment bank may be used to quickly fix (i.e., lock) the output frequency of the LC resonance DCO to a desired target PLL frequency. When the output frequency approaches the target PLL frequency, the output frequency is handed over to the fine adjustment bank in response to a mode shifting signal. Then, the fine adjustment bank operates such that the output frequency is locked to the target PLL frequency through fine adjustment operation. The digital lock detector 104 may generate a signal for shifting the DCO from the coarse adjustment bank to the fine adjustment bank.

The phase detector 101 may generate a phase error between the FCW and the output signal of the DCO 103. The phase error signal outputted from the phase detector 101 may be inputted to the digital loop filter 102 as a binary k-bit digital signal.

The digital loop filter 102 may scale down the k-bit digital phase error signal into an m-bit digital signal, and then, output control bits to the DCO 103. The coarse adjustment bank and the fine adjustment bank are controlled in response to the m-bit output signal of the digital loop filter 102, and therefore the output frequency of the DCO 103 corresponding to the phase error can be outputted. The output frequency of the DCO 103 is continuously changed according to a digital phase error signal, such that a digital phase lock loop is locked to a PLL frequency determined by the FCW value.

The digital lock detector 104 may receive control bits from the digital loop filter 102, generate a lock indication signal to notice whether the output frequency of the DCO 103 is locked to a target PLL frequency or not, and then providing the lock indication signal to the DCO 103. That is, the digital lock detector 104 may generate the lock indication signal, which can serves to convert a coarse adjustment mode of the DCO 103 into a fine adjustment mode.

Figure 2:
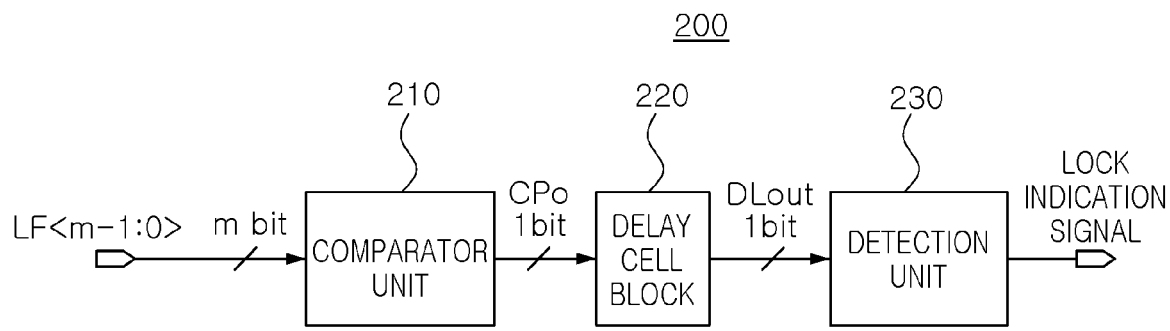
FIG. 2 is a configuration view showing a digital lock detector according to an exemplary embodiment of the present invention.

FIG. 2 is a configuration view illustrating a digital lock detector according to another exemplary embodiment of the present invention.

Referring to FIG. 2, a digital lock detector 200 may include a comparator unit 210, a delay cell block 220, and a detection unit 230.

The comparator unit 310 may receive a plurality of control bits outputted from a digital loop filter 102, and output a single-bit signal containing information about each bit outputted from the digital loop filter 102. According to this embodiment, the comparator unit 310 may output the single-bit signal upon calculating the duration for which each of the plurality of control bits having different lock durations is locked, and the duration for which the plurality of control bits are all locked. The single-bit signal outputted from the comparator unit 310 may contain bit information regarding the lock condition of the plurality of control bits outputted from the digital loop filter 102.

The delay cell block 420 outputs a clock signal by combining the single-bit signal from the comparator unit 310 with a delayed signal, the delayed by a preset time. According to this embodiment, the delay cell block 420 may include a delay part that delays a bit signal outputted from the comparator unit 310 by a preset time, and an logic operation part performing a logic OR operation on the bit signal outputted from the comparator unit 310 and an output signal of the delay part The detection unit 230 may output a lock indication signal to the DCO 103 according to a clock signal outputted from the delay cell block 220. The detection unit 230 may recognize the time point when the clock signal of the delay cell block 420 shifts from a logic low state to a logic high state. At this recognized time point, the detection unit 230 may generate a lock indication signal being output to the DCO 103. The detection unit 230 may include a latch circuit detecting the time point when a clock signal outputted from the delay cell block 420 shifts its logic state, and a pulse generator generating a lock indication signal in response to the output of the latch circuit.

Figure 3:
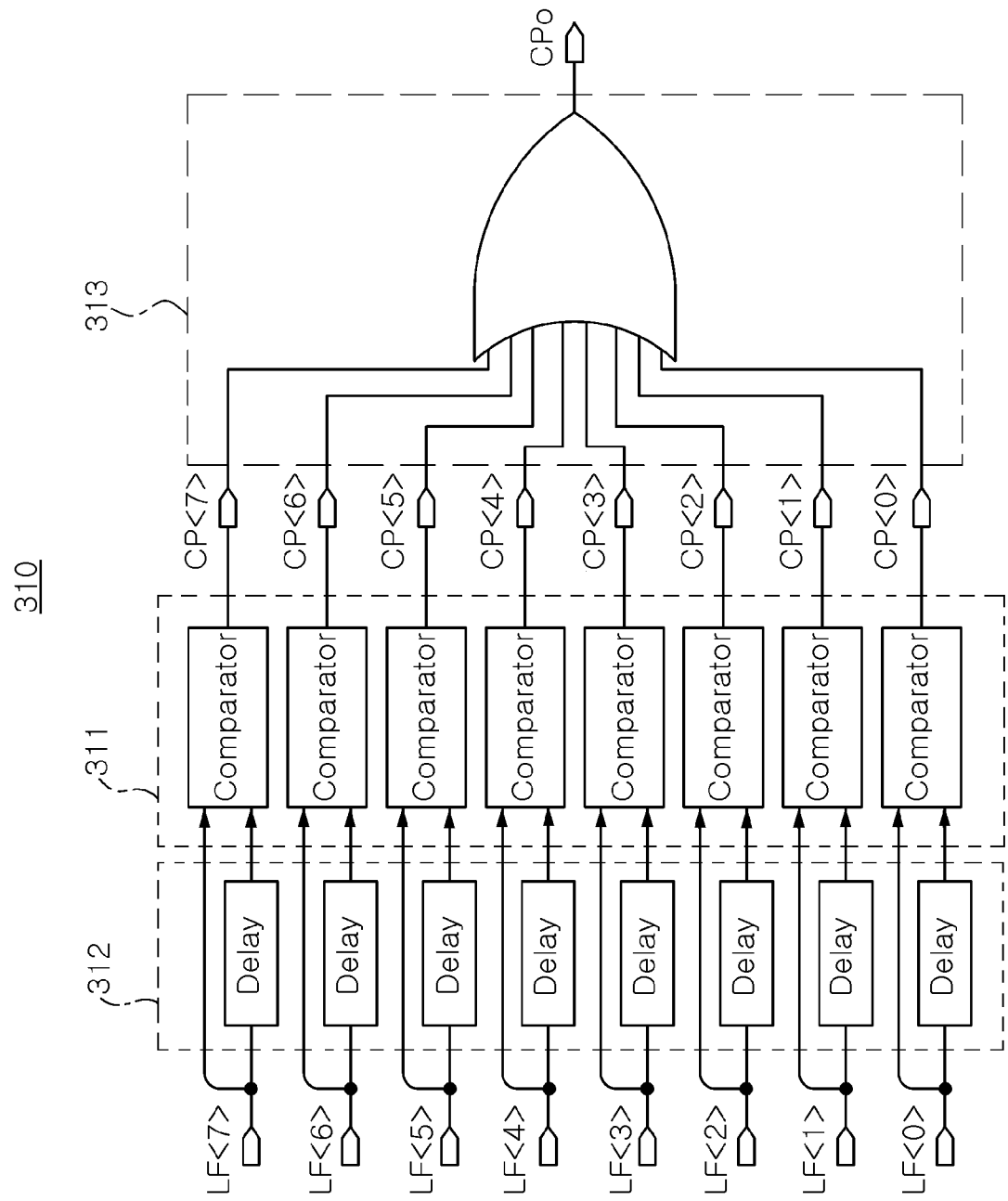
FIG. 3 is a configuration view showing a comparator unit in the digital lock detector, according to an exemplary embodiment of the present invention.

FIG. 3 is a configuration view illustrating a comparator unit in the digital lock detector, according to another exemplary embodiment of the present invention.

Referring to FIG. 3, a comparator unit 310 may include a plurality of delays 312, a plurality of comparators 311 and a logic operator 313. The comparator unit 210 will be described in detail with reference to FIGS. 6 through 8, as well as FIG. 3.

Figure 6:
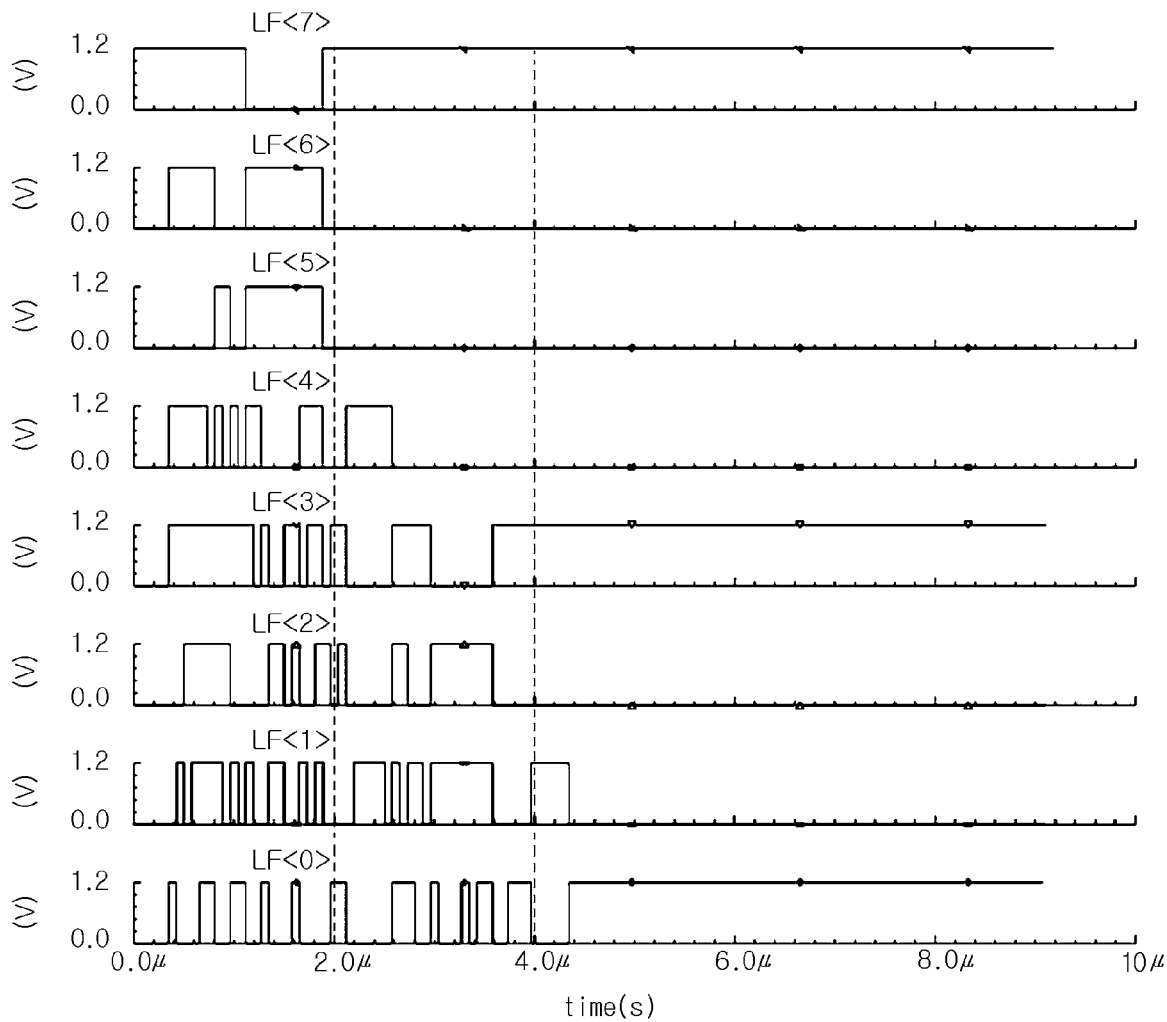
FIG. 6 is a graph showing a plurality of control bits inputted to delays of the comparator unit according to an exemplary embodiment of the present invention.

The plurality of delays 312 may delay a plurality of control bits, outputted from the digital loop filter 102, by a preset time, respectively. According to this embodiment, each of the plurality of control bits, outputted from the digital loop filter 102, may be delayed by a single clock of a reference frequency. The plurality of delays 312 may be implemented as D-flip-flops, respectively. FIG. 6 illustrates a plurality of control bits outputted from the digital loop filter 102. According to this embodiment, the control bits outputted from the digital loop filter 102 may be 8 bits. The number of control bits may vary according to the number of bits of a capacitor bank implemented in the DOC 103. According to this embodiment, the reference frequency may be about 13 MHz, and the single clock of the reference frequency may be set to about 0.08 μs. Accordingly, when passed through the delays 312, the control bits shown in FIG. 6 may be expressed as a bit signal shifted by about 0.08 μs with respect to a time axis.

Figure 7:
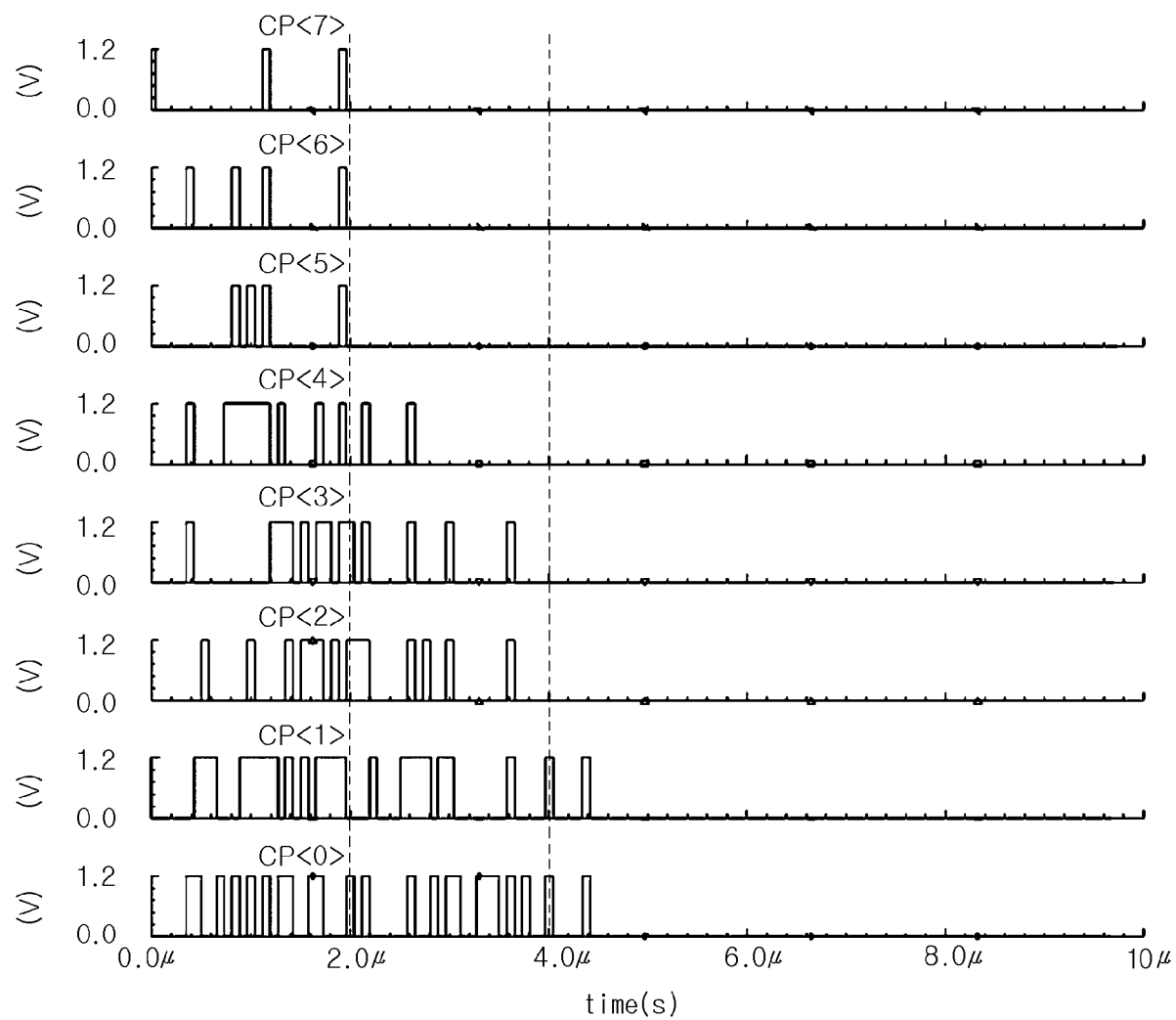
FIG. 7 is a graph showing a plurality of control bits outputted from comparators of the comparator unit according to an exemplary embodiment of the present invention.

The plurality of comparators 311 may receive the plurality of control bits outputted from the digital loop filter 102, and the delayed control bits from the plurality of delays 312, and perform an exclusive OR (XOR) operation thereupon. FIG. 7 illustrates output signals outputted after the control bits have passed through the delays 312 and the comparators 311. Referring to FIGS. 6 and 7, a control bit from the digital loop filter 102, and a bit signal, which is the delayed control bit by the single clock of a reference frequency, may overlap each other in terms of a logic state (logic high state or logic low state) or may be in different states. According to this embodiment, each comparator 311 performs an XOR operation on two inputted signals and outputs the resultant signal of the XOR operation. In detail, when the control bit from the digital loop filter 102 and the bit signal, the delayed control bit, are indifferent logic states, a logic high signal is outputted. When the control bit and the bit signal are in the same logic state, a logic low signal is outputted.

As shown in FIG. 6, a plurality of control bits LF<0> to LF<7>, outputted from the digital loop filter 102, are maintained constant value when a predetermined time is passed. That is, the control bits from the digital loop filter 102 may maintain its logic high state or logic low state after about 5 μs. This indicates the locked condition of a PLL including the digital loop filter 102.

As shown in FIG. 7, each of bit signals CP<0> to CP<7> having passed through of the respective comparators 311 may maintain a logic low state after the predetermined time. This indicates the locked state of the digital PLL. According to this embodiment, a first bit signal CP<0> and an eighth bit signal CP<7> may maintain a logic low state after about 4.5 μs and about 2 μs, respectively. Thus, the predetermined time, which is needed for locking a plurality of bit signals, can be calculated on the basis of the bit signals CP<0> to CP<7> having passed through the comparators 311, respectively.

Figure 8:
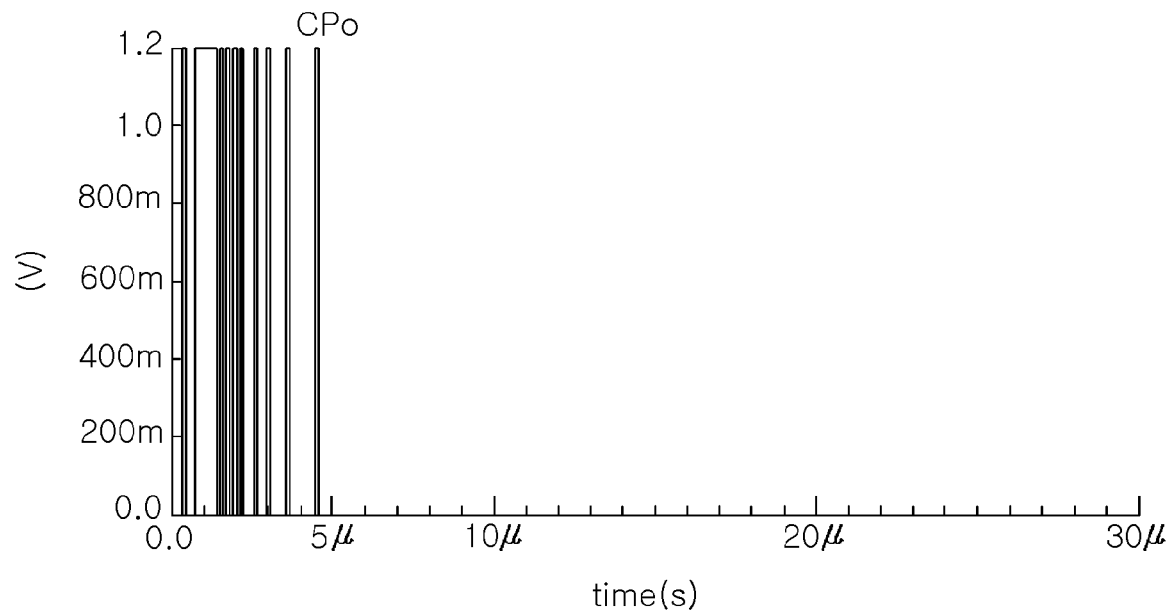
FIG. 8 is a graph showing a single control bit outputted from an operator of the comparator unit according to an exemplary embodiment of the present invention.

The logic operator 313 may output a single-bit signal by performing an OR operation on the signals respectively outputted from the plurality of comparators 311. FIG. 8 illustrates a signal having passed through the logic operator 313. Referring to FIG. 8, a signal CPo having passed through the operator 311 is irregularly repeated between logic high and logic low states for about 4 μs, and maintains a logic low state afterwards. In such a manner, the predetermined time (about 4 μs in this embodiment) for the entirety of the plurality of control bits from the digital loop filter 102 to be locked can be calculated from the output of the logic operator 313.

As described above, the comparator unit 310 outputs a single bit upon receiving the plurality of control bits from the digital loop filter 102. The single bit may contain information about each bit outputted from the digital loop filter 102. The information about each bit may be information indicating the time point when each control bit signal is locked.

Figure 4:
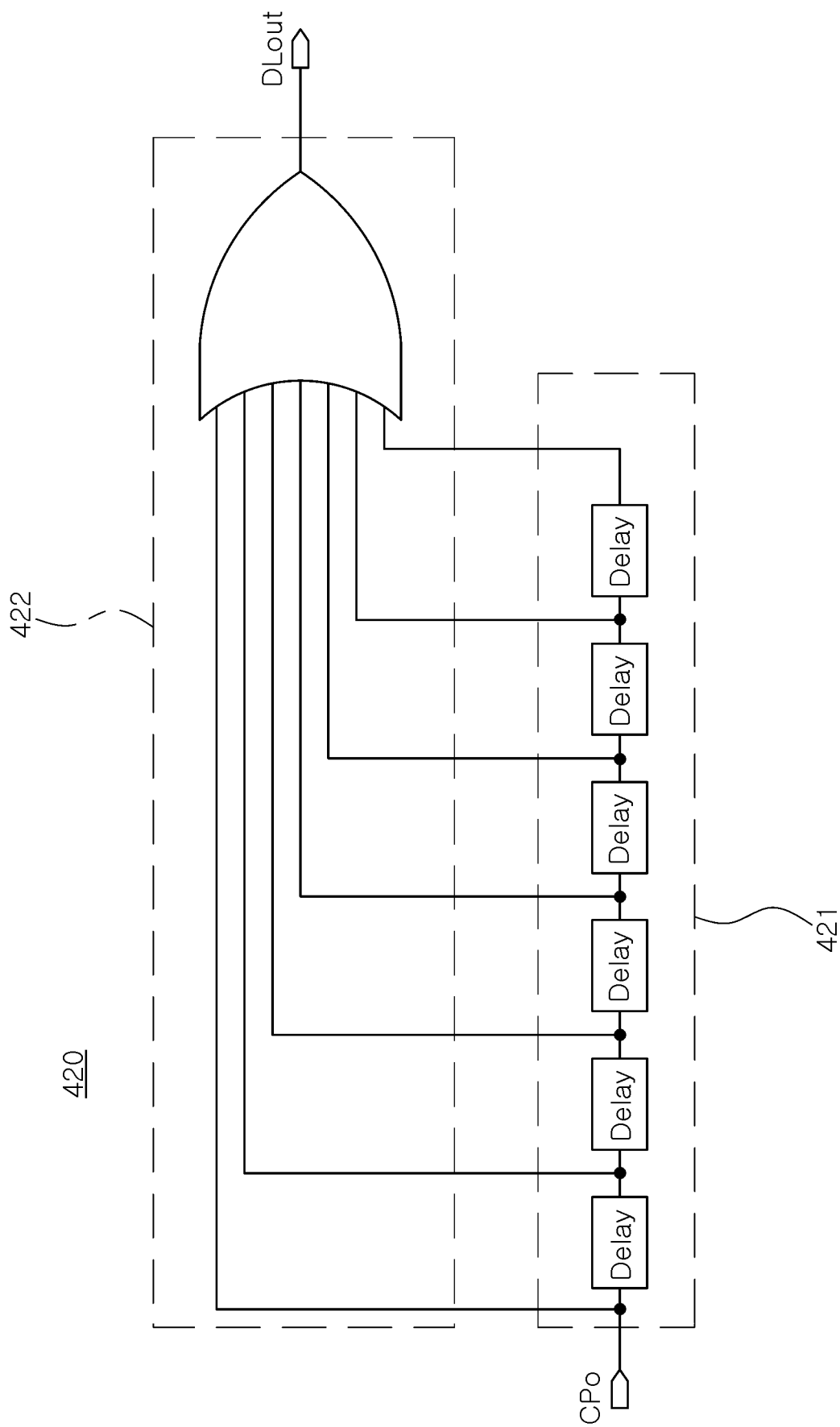
FIG. 4 is a configuration view showing a delay cell block in the digital lock detector, according to an exemplary embodiment of the present invention.

FIG. 4 is a configuration view showing a delay cell block of the digital lock detector, according to an exemplary embodiment of the present invention.

Referring to FIG. 4, a delay cell block 420 according to this embodiment may include a delay part 421 and an operation part 422. The delay cell block 420 will now be described in detail with reference to FIGS. 4 and 9.

The delay part 421 may delay a bit signal CPo outputted from the comparator unit 310 by a preset time. According to this embodiment, the bit signal CPo is delayed by the single clock of a reference frequency.

The operator 422 may perform an OR operation on the bit signal CPo from the comparator unit 310, and the output signal of the delay part 421.

According to this embodiment, the delay part 421 may include a plurality of delays connected in series to each other. The plurality of delays may each delay an inputted signal by the single clock of the reference frequency. The operator 422 may perform an OR operation on the bit signal CPo from the comparator unit 310 and an output signal outputted from each of the delays. In this embodiment, six delays are connected in series to each other, such that the bit signal CPo from the comparator unit 310 and the output signal outputted from each of the six delays are subjected to an OR operation, and the resultant signal of the OR operation is outputted. Accordingly, the signal having passed through all the six delays may be delayed by about 0.5 μs, as compared to the bit signal CPo inputted to the delay part 421. The output signal of the delay cell block 420 is as illustrated in FIG. 9.

Figure 9:
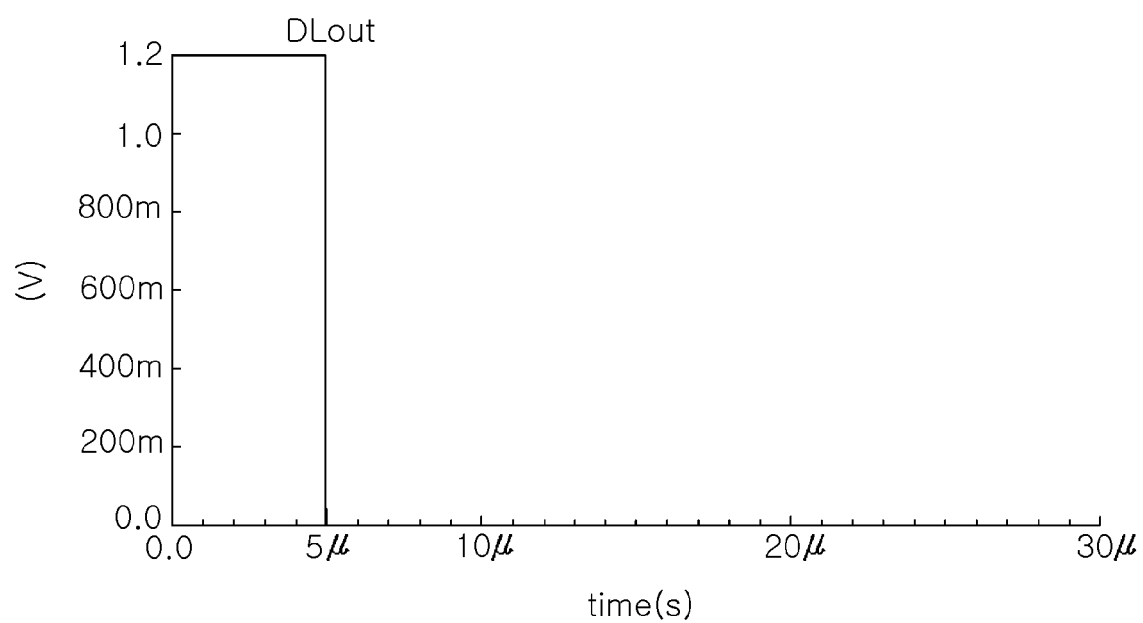
FIG. 9 is a graph of a pulse signal outputted from the delay cell block of the digital lock detector according to an exemplary embodiment of the present invention.

Referring to FIGS. 8 and 9, the signal CPo inputted to the delay cell block 421 is irregularly repeated between logic high and logic low states for about 4.5 μs, and maintains a logic low state afterwards. When the delay cell block 420 delays this bit signal CPo six times by a reference clock, and performs an OR operation on the output and the bit signal from the comparator unit 310, a clock signal DLout may be outputted that is logic high for about 5 μs and logic low afterwards.

Figure 5:
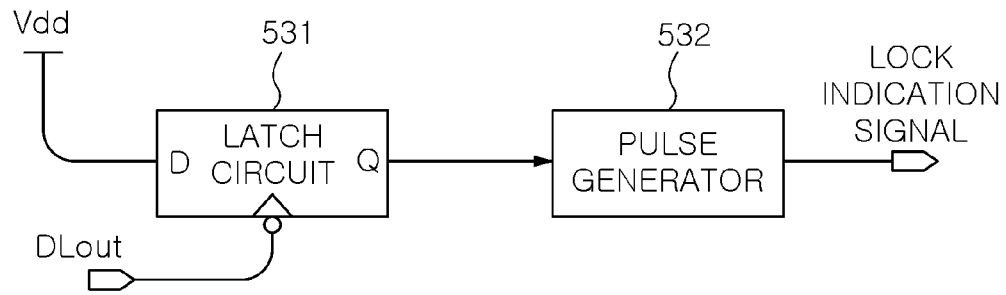
FIG. 5 is a configuration view showing a detection unit in the digital lock detector, according to an exemplary embodiment of the present invention.

FIG. 5 is a configuration illustrating a detection unit of the digital lock detector, according to an exemplary embodiment of the present invention.

Referring to FIG. 5, a detection unit 530, according to this embodiment, may include a latch circuit 531 and a pulse generator 532.

The latch circuit 531 may detect the time point when the state of the clock signal DLout from the delay cell block 420 transitions. According to this embodiment, the latch circuit may be a negative-edge triggered D-flip/flop. The clock signal DLout outputted from the delay cell block 420 is inputted to the latch circuit 531, and the output of the latch circuit 531 transitions from a logic low state to a logic high state when the clock signal shifts from a logic high state to a logic low state.

The pulse generator 532 may generate a lock indication signal on the basis of the output of the latch circuit 531. According to this embodiment, the pulse generator 532 may generate a lock indication signal when the output of the latch circuit 531 shifts from a logic low state to a logic high state.

Figure 10A:
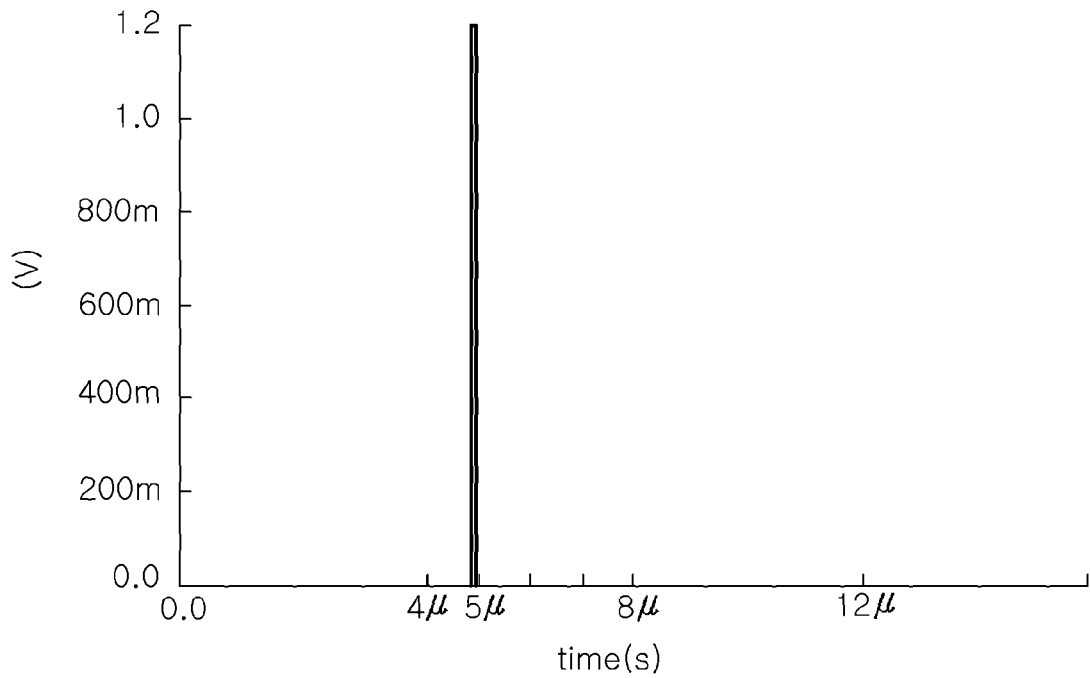
FIGS. 10A and 10B are graphs respectively showing a lock indication signal inputted to a DCO and an output signal from the DCO in a frequency synthesizer using the digital lock detector, according to an exemplary embodiment of the present invention.

A signal shown in FIG. 10A may be a lock indication signal outputted from the pulse generator 532. The lock indication signal may be a logic high signal inputted at the time point corresponding to a falling edge of the clock signal DLout inputted to the detection unit 530. In this embodiment, the lock indication signal may be generated at about 5 μs.

The lock indication signal is inputted to the DCO 103, thereby shifting the output frequency resolution of the DCO 103 from the coarse adjustment bank to the fine adjustment bank. Accordingly, after the pulse generator 532 generates the lock indication signal, the DCO 103 may perform fine adjustment upon an output frequency.

Figure 10B:
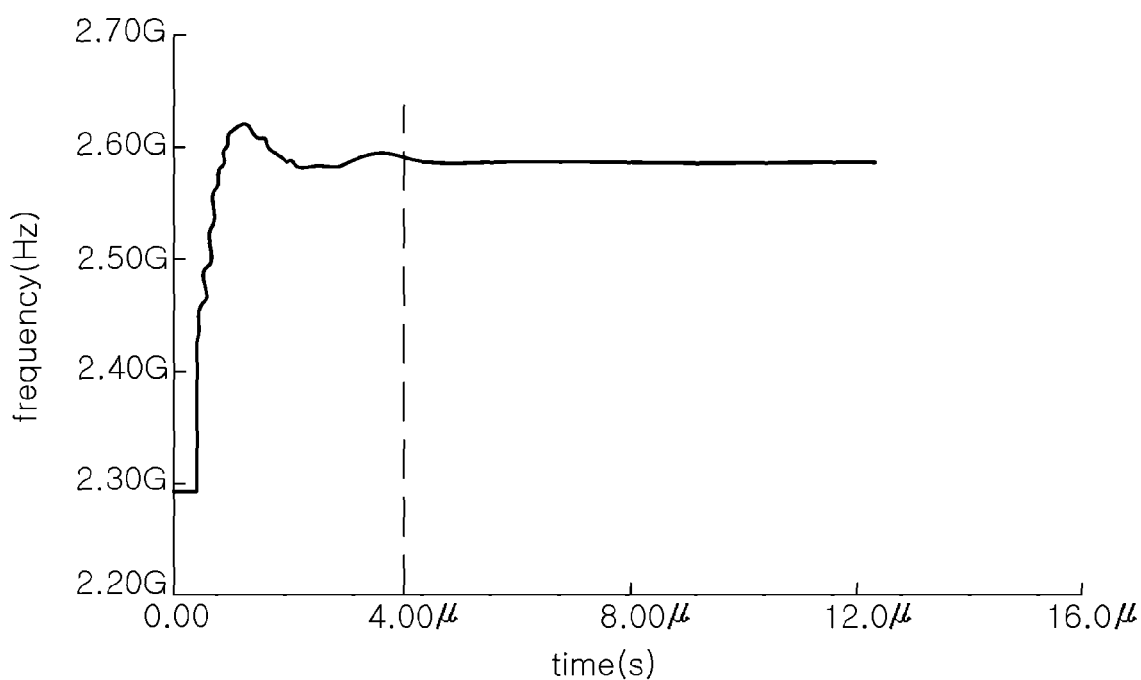

FIG. 10B illustrates a frequency outputted from a PLL using the digital lock detector according to this embodiment. Referring to FIG. 10B, it can be seen that the output frequency varies over time before about 5 μs, and afterwards, is fixed to a constant value and thus locked.

As set forth above, according to exemplary embodiments of the invention, the digital lock detector and the frequency synthesizer, capable of detecting the lock condition of the digital PLL, can be obtained by using simple delay circuits and comparator circuits.

While the present invention has been shown and described in connection with the exemplary embodiments, it will be apparent to those skilled in the art that modifications and variations can be made without departing from the spirit and scope of the invention as defined by the appended claims.

What is claimed is:

1. A digital lock detector including:
   a comparator unit receiving a plurality of control bits, and generating a bit signal to notice a lock condition of the plurality of control bits;
   a delay cell block generating a plurality of delay signals based on the bit signal, and outputting a clock signal by combining the bit signal and the plurality of delay signals; and
   a detection unit detecting a shift time of the clock signal, and generating a lock indication signal according to the detection result.

2. The digital lock detector of claim 1, wherein the comparator unit outputs the single-bit signal by calculating time for which each of the plurality of control bits is locked, and time for which the plurality of control bits are all locked.

3. The digital lock detector of claim 1, wherein the comparator unit comprises:
   a plurality of delays delaying the plurality of control bits by a preset time, respectively;
   a plurality of comparators performing an exclusive OR (XOR) between the plurality of control bits and output of the plurality of delays; and
   an logic operator generating the bit signal by performing an OR operation on output of the plurality of comparators.

4. The digital lock detector of claim 1, wherein the delay cell block comprises:
   a delay part generating the plurality of delay signals based on the bit signal; and
   a logic operation part performing an OR operation on the bit signal and the plurality of delay signals generated by the delay part.

5. The digital lock detector of claim 4, wherein the delay part comprises a plurality of delays connected in series to each other, and generates the plurality of delay signals through the plurality of delays,
   wherein the logic operation part performs an OR operation on the bit signal and the plurality of delay signals generated by the plurality of delays.

6. The digital lock detector of claim 1, wherein the detection unit comprises:
   a latch circuit detecting a time point when the clock signal outputted from the delay cell block shifts its logic state; and
   a pulse generator generating the lock indication signal on the basis of an output of the latch circuit.

* * * * *